(12) United States Patent
Van Bommel et al.

(10) Patent No.: US 11,519,562 B2
(45) Date of Patent: Dec. 6, 2022

(54) LED FILAMENT ARRANGEMENT

(71) Applicant: SIGNIFY HOLDING B.V., Eindhoven (NL)

(72) Inventors: Ties Van Bommel, Horst (NL); Rifat Ata Mustafa Hikmet, Eindhoven (NL); Johannes Petrus Maria Ansems, Hulsel (NL)

(73) Assignee: Signify Holding B.V., Eindhoven (NL)

( * ) Notice: Subject to any disclaimer, the term of this patent is extended or adjusted under 35 U.S.C. 154(b) by 0 days.

(21) Appl. No.: 17/434,078

(22) PCT Filed: Mar. 12, 2020

(86) PCT No.: PCT/EP2020/056582
§ 371 (c)(1),
(2) Date: Aug. 26, 2021

(87) PCT Pub. No.: WO2020/182925
PCT Pub. Date: Sep. 17, 2020

(65) Prior Publication Data
US 2022/0154891 A1 May 19, 2022

(30) Foreign Application Priority Data
Mar. 14, 2019 (EP) .................................... 19162806

(51) Int. Cl.
| | |
|---|---|
| *F21K 9/00* | (2016.01) |
| *F21K 9/232* | (2016.01) |
| *F21K 9/66* | (2016.01) |
| *F21K 9/275* | (2016.01) |
| *F21Y 109/00* | (2016.01) |
| *F21Y 115/10* | (2016.01) |

(52) U.S. Cl.
CPC .............. *F21K 9/232* (2016.08); *F21K 9/275* (2016.08); *F21K 9/66* (2016.08); *F21Y 2109/00* (2016.08); *F21Y 2115/10* (2016.08)

(58) Field of Classification Search
CPC ............. F21K 9/275; F21K 9/66; F21K 9/232
See application file for complete search history.

(56) References Cited

U.S. PATENT DOCUMENTS

| | | | | |
|---|---|---|---|---|
| 10,663,119 B2* | 5/2020 | Lin | ........................ | F21S 4/22 |
| 2016/0139328 A1* | 5/2016 | Hikmet | ................... | F21S 41/16 |
| | | | | 362/84 |

(Continued)

FOREIGN PATENT DOCUMENTS

| | | |
|---|---|---|
| CN | 203453855 U | 2/2014 |
| CN | 207407096 U | 5/2018 |

(Continued)

*Primary Examiner* — Gerald J Sufleta, II (57) ABSTRACT

A light emitting diode, LED, filament arrangement (100), comprising at least one LED filament (120) comprising an array of a plurality of light emitting diodes (140), LEDs. The LED filament comprises a substrate (150) on which the plurality of LEDs is arranged. The substrate surface comprises at least one of a multi-faceted surface structure (160), a lens structure (161), and a grating structure (162) and is configured to at least partially refract, at least partially reflect, and/or at least partially diffract the light emitted from the at least one LED filament during operation.

13 Claims, 7 Drawing Sheets

(56) References Cited

U.S. PATENT DOCUMENTS

| | | | |
|---|---|---|---|
| 2016/0178133 A1* | 6/2016 | Kong | F21K 9/232 |
| | | | 362/382 |
| 2016/0300820 A1 | 10/2016 | Sabathil et al. | |
| 2017/0012177 A1 | 1/2017 | Trottier | |
| 2018/0045379 A1* | 2/2018 | Jiang | F21K 9/68 |
| 2018/0315899 A1* | 11/2018 | Li | F21V 31/00 |

FOREIGN PATENT DOCUMENTS

| | | |
|---|---|---|
| WO | 2014114241 A1 | 7/2014 |
| WO | 2017162821 A2 | 9/2017 |

* cited by examiner

LED FILAMENT ARRANGEMENT

CROSS-REFERENCE TO PRIOR APPLICATIONS

This application is the U.S. National Phase application under 35 U.S.C. § 371 of International Application No. PCT/EP2020/056582, filed on Mar. 12, 2020, which claims the benefit of European Patent Application No. 19162806.4, filed on Mar. 14, 2019. These applications are hereby incorporated by reference herein.

FIELD OF THE INVENTION

The present invention generally relates to lighting arrangements comprising one or more light emitting diodes. More specifically, the present invention is related to a light emitting diode (LED) filament arrangement.

BACKGROUND OF THE INVENTION

The use of light emitting diodes (LED) for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

In particular, there is currently a very large interest in lighting devices and/or arrangements (such as lamps) provided with LEDs, and incandescent lamps are rapidly being replaced by LED-based lighting solutions. It is nevertheless appreciated and desired to have retrofit lighting devices (e.g. lamps) which have the look of an incandescent bulb. For this purpose, it is possible to make use of the infrastructure for producing incandescent lamps based on LED filaments arranged in such a bulb. In particular, LED filament lamps are highly appreciated as they are very decorative.

In WO 2014/114241 an LED illumination device is disclosed comprising a transparent housing, an LED light-emitting device and a support, forming a closed chamber in which the LED light-emitting device is located. The chamber is filled with an inert gas, for conducting heat generated by the LED light-emitting device to the outside of the transparent housing. Thus the shape, size and weight of the LED illumination device need no longer be restricted by a heat dissipating body.

However, as LED filament lamps are often intended for decorative applications, lamps of this kind may suffer from an unsatisfactory light distribution.

Hence, it is an object of the present invention to try to overcome at least some of the deficiencies of present LED filament lamps regarding their distribution of light during operation.

SUMMARY OF THE INVENTION

This and other objects are achieved by providing a LED filament arrangement having the features in the independent claim. Preferred embodiments are defined in the dependent claims.

A LED filament is understood to be a light emitting element that is providing LED filament light and comprises a plurality of light emitting diodes (LEDs) arranged in a linear array. Preferably, the LED filament has a length L and a width W, wherein L>5 W. The LED filament may be arranged in a straight configuration or in a non-straight configuration such as for example a curved configuration, a 2D/3D spiral or a helix. Preferably, the LEDs are arranged on an elongated carrier like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods.

The LED filament may comprise multiple sub-filaments.

Hence, according to a first aspect of the present invention, there is provided a light emitting diode, LED, filament arrangement. The LED filament arrangement comprises at least one LED filament comprising an array of a plurality of light emitting diodes LEDs. The LED filament further comprises a substrate on which the plurality of LEDs is arranged, wherein the substrate surface comprises at least one of a multi-faceted surface structure, a lens structure and a grating structure. The substrate surface is further configured to at least partially refract, at least partially reflect, and/or at least partially diffract, the light emitted from the at least one LED filament during operation.

By the term "multi-faceted surface structure" is meant a surface with several facets throughout or over the surface. In other words, the "multi-faceted surface structure" comprises a faceted surface with several facets. Each single facet or the facet surface may have a different angle of its normal to the facet or surface facet if compared to neighboring (adjacent) facets or facet surfaces. Hence, light from the LED under operation may refract or reflect in or on such facets or surfaces in a direction that is significantly changed between one facet or surface to another due to the change of facet or surface orientation.

By the term "lens structure" it is hereby meant that at least a part of the surface comprises a bent surface. The bent surface may be at least partially circular, at least partially oval, or the like. Preferably, the structure of the substrate is protruding from its surface, creating a convex lens structure. Alternatively, the structure of the substrate may be extracting inward in the surface, creating a concave lens structure. A lens structure could also be formed as an elongated bent surface protruding from and along the substrate surface. The elongated lens structure could also stretch along the edges of the substrate. In other words, the "lens structure" is a surface structure affecting the light passing the surface similar to how a typical optical lens would affect the light, i.e. the refracting properties of a "lens structure" according to this invention is similar to those of concave or convex optical lenses. In case of a lens structure being elongated, the effect on the refracting properties may typically resemble a typical lens in a direction perpendicular to the direction of the elongation of said lens structure.

By the term "grating structure" it is here meant a surface with one or more gratings arranged or provided on the surface. The grating(s) may affect light from the LED by refraction, reflection and/or diffraction of the light from the LED impinging on the surface.

Thus, the present invention is based on the idea of providing a LED filament arrangement wherein the LED filament, via its substrate surface, may be able to distribute the light emitted from the LEDs on the LED filament via refraction, reflection, and/or diffraction. In other words, a decorative lighting may be achieved by light from the LEDs being refracted, reflected, and/or diffracted in or by the inventive LED filament substrate. The decorative lighting of the LED filament arrangement according to the present invention may be referred to as sparkled light since the LED filament arrangement may appear to twinkle and/or sparkle when the viewing angle of an observer of said LED filament arrangement is slightly changed.

The plurality of LEDs of the LED filament arrangement may provide multiple sources for light to be refracted, reflected, and/or diffracted in or by the inventive LED filament substrate and thus provide for an improved sparkling and/or twinkle effect. Hence, the plurality of LEDs may increase the number of viewing angles beneficial for an observer to experience the sparkling or twinkling effect of the LED filament arrangement during operation. The reflection of the light from the plurality of LEDs may be due to total internal reflection or by reflection on a surface with reflective properties. The refraction of the light may be achieved by light passing through the substrate if the substrate or at least part of the substrate is at least partially translucent or transparent.

According to an embodiment of the present invention, the substrate may be at least partially translucent or transparent. The present embodiment is advantageous in that it provides a substrate that may enable refraction to be achieved by light passing through the substrate and may thus increase the light distribution angle, i.e. the angle of which light is distributed from the LED filament arrangement during operation.

According to an embodiment of the present invention, the substrate may be at least partially opaque. This may provide for a LED filament which is able to reflect light in a certain, desired direction, thus increasing control of the angle of the light distribution.

According to an embodiment of the present invention, the LED filament arrangement may comprise at least one first portion of the substrate, on which the plurality of LEDs is arranged, which is flat. The flat first portion of the substrate may hereby provide a surface which is optimal to apply LEDs upon. An arrangement of LEDs on a non-flat surface may affect the application of LEDs negatively and make the application more difficult. In contrast, by providing a flat part of the surface structure may provide for a facilitated application of the LEDs whilst a remaining portion of the substrate may comprise the desired surface structure according to this invention.

According to an embodiment of the present invention, the at least one LED filament may further comprise an encapsulant comprising a translucent material, wherein the encapsulant at least partially encloses the plurality of LEDs and at least partially encloses the substrate. At least a part of the substrate surface may be configured to also at least partially refract, at least partially reflect, and/or at least partially diffract at least a part of the light which may be scattered or converted in the encapsulant material. By the term "encapsulant", it is here meant a material encapsulating, for example, at least part of the LEDs and/or the substrate. This may provide for improved light distribution properties and characteristics of the LED filament arrangement, since the light may scatter or may be converted in the encapsulant material. This may further provide an improved light spectrum distribution.

According to an embodiment of the present invention, the substrate may comprise at least one second portion which is not enclosed by the encapsulant, and wherein at least one of the at least one second portion comprises a multi-faceted surface structure, a lens structure, and/or a grating structure. The present embodiment is advantageous in that a combination of an improved structure surface according to present invention together with a surface covered with an encapsulant material. The surface structure affects the light from the LEDs and/or from the light which is scattered or converted in the encapsulant material, which may further impinge on the substrate surface by refraction, reflection and/or diffraction where there is no encapsulant material.

According to an embodiment of the present invention, the encapsulant may comprise phosphor. The present embodiment is advantageous in that the light from the LEDs may be converted in the encapsulant due to the luminescent properties of phosphor. According to an embodiment of the present invention, the substrate may have the shape of a rectangular slab and elongate along a longitudinal first axis, A. The substrate may further extend along a second axis, B, being perpendicular to said first axis, A. The substrate may further extend along a third axis C, being perpendicular to both said first and second axes, wherein at least one of the surfaces, $S_1$-$S_6$, of the substrate may comprise a multi-faceted surface structure, a lens structure, and/or a grating structure.

According to an embodiment of the present invention, the substrate may comprise a first surface, $S_1$, comprising a first normal which is parallel to said third axis. The substrate may further comprise a second surface, $S_2$, comprising a second normal in the opposite direction to said first normal. The substrate may further comprise a third surface, $S_3$, comprising a third normal which is parallel to said second axis. The substrate may further comprise a fourth surface, $S_4$, comprising a fourth normal in the opposite direction to said third normal. At least one of the first surface, $S_1$, the second surface, $S_2$, the third surface, $S_3$, and the fourth surface, $S_4$, may comprise a multi-faceted surface structure, a lens structure, and/or a grating structure according to the concept of the present invention.

According to an embodiment of the present invention, at least one of the combinations of the first surface, $S_1$, and the second surface, $S_2$; the third surface, $S_3$, and the forth surface, $S_4$; and the first surface, $S_1$, the second surface, $S_2$, the third surface, $S_3$, and the fourth surface, $S_4$; may comprise a multi-faceted surface structure, a lens structure, and/or a grating structure according to the concept of the present invention.

Some of the above embodiments may provide for several different alternatives and combinations of arranging the surface structure according to the present invention and thus a customized appearance may be achieved.

According to an embodiment of the present invention, the substrate may comprise a respective edge between any pair of adjacently arranged surfaces, $S_1$-$S_6$, wherein at least one of the respective edges comprises a multi-faceted surface structure, a lens structure, and/or a grating structure. This may provide for the edges of the substrate to be specifically affected by the surface structure according to the present invention.

According to an embodiment of the present invention, there is provided a lighting device, comprising a LED filament arrangement according to any preceding embodiment of present invention. The lighting device further comprises a cover comprising an at least partially light transmissive material, wherein the cover at least partially encloses the LED filament arrangement. The LED filament further comprises an electrical connection connected to the LED filament arrangement for a supply of power to the plurality of LEDs of the LED filament arrangement. By the term "light transmissive material", it is here meant a material with properties which are beneficial for light to transmit through it. In other words, the material may have a relatively low absorption to light within the range of visible wavelengths. In other words, the material may have a relatively high transmittance within the range of visible wavelengths. The present embodiment is advantageous in that an assembled lighting device may be provided which comprises the LED filament arrangement according to the present invention, leading to a lighting device with sparkling and/or twinkling characteristics.

According to a second aspect of the present invention, there is provided a method of manufacturing a light emitting diode, LED, filament arrangement. The method comprises the steps of providing a substrate which has the shape of a rectangular slab and elongates along a longitudinal first axis, A, wherein the substrate further extends along a second axis, B, being perpendicular to said first axis, A, and extends along a third axis C, being perpendicular to both said first and second axes, wherein the substrate comprises a first surface, $S_1$, comprising a first normal which is parallel to said third axis, a second surface, $S_2$, comprising a second normal in the opposite direction to said first normal, a third surface, $S_3$, comprising a third normal which is parallel to said second axis; and a fourth surface, $S_4$, comprising a fourth normal in the opposite direction to said third normal. The method further comprises the step of creating an electrode pattern on at least one of the first surface, $S_1$, and the second surface, $S_2$, of the substrate. The method further comprises mounting a plurality of light-emitting diodes, LEDs, on at least one of the first surface, $S_1$, and the second surface, S2, of the substrate. The method further comprises the step of arranging a wire bonding between the plurality of LEDs and the electrode pattern. The method further comprises dispensing a translucent material on at least a portion of the first surface, $S_1$, and the second surface, $S_2$, of the substrate. The method further comprises the step of creating a multi-faceted surface structure on at least a portion of at least one of the first surface, $S_1$, the second surface, $S_2$, the third surface, $S_3$, and the fourth surface, $S_4$. It will be appreciated that the second aspect of the present invention shares the innovative concept of the first aspect of the present invention, namely that of providing a LED filament arrangement by which a decorative lighting may be achieved by light from the LEDs being refracted, reflected, and/or diffracted in or by the LED filament substrate.

According to an embodiment of the present invention, the method of manufacturing a LED filament arrangement may further comprise a substrate that is at least partially translucent or transparent.

According to an embodiment of the present invention, the method of manufacturing a LED filament arrangement, may further comprise a substrate that is at least partially opaque.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1:
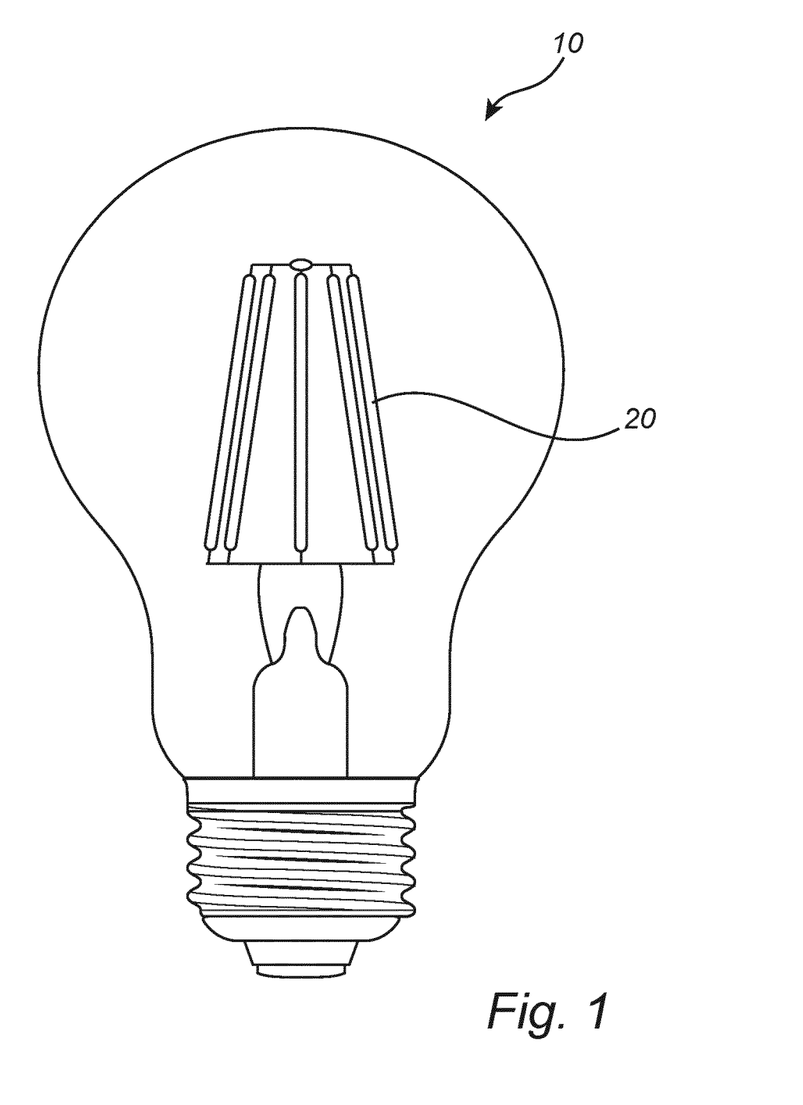
FIG. 1 schematically shows a LED filament lamp according to the prior art, comprising LED filaments.

FIG. 1 shows a LED filament lamp 10 according to the prior art, comprising a plurality of LED filaments 20. LED filament lamps 10 of this kind are highly appreciated as they are very decorative, as well as providing numerous advantages compared to incandescent lamps such as a longer operational life, a reduced power consumption, and an increased efficiency related to the ratio between light energy and heat energy. However, as LED filament lamps 10 of this kind are often intended for decorative applications, the lamps may suffer from an unsatisfactory light distribution and improvement in appearance is highly desirable.

Figure 2:
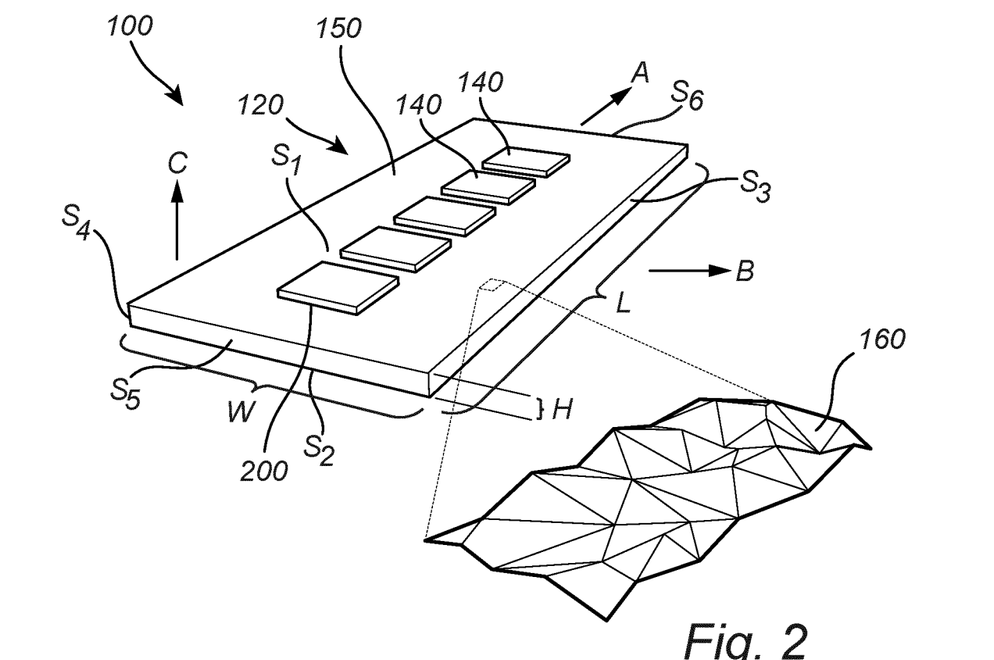
FIGS. 2-7 schematically show perspective views of a LED filament arrangement according to exemplifying embodiments of the present invention.

FIG. 2 schematically shows a perspective view of a light emitting diode, LED, filament arrangement 100. The LED filament arrangement 100 comprises at least one LED filament 120 comprising an array of a plurality of light emitting diodes 140, LEDs. The LED filament 120 further comprises a substrate 150 on which the plurality of LEDs is arranged. The substrate 150 may have the shape of a rectangular slab and elongates along a longitudinal first axis, A, of the substrate 150. This could also be referred to as the length, L, of the LED filament 120. The substrate 150 further extends along a second axis, B, being perpendicular to said first axis, A. This could also be referred to as the width, W, of the LED filament 120. The substrate 150 further extends along a third axis C, being perpendicular to both said first and second axes. This could also be referred to as the thickness, H, of the LED filament 120. The substrate 150 may comprise a first surface, $S_1$, comprising a first normal which is parallel to said third axis, C. The substrate 150 may further comprise a second surface, $S_2$, comprising a second normal in the opposite direction to said first normal. The substrate 150 may further comprise a third surface, $S_3$, comprising a third normal which is parallel to said second axis, B. The substrate 150 may further comprise a fourth surface, $S_4$, comprising a fourth normal in the opposite direction to said third normal.

The substrate 150 of the LED filament 120 according to present invention may be of any material suitable for the purpose of functioning as a carrier or substrate. The material of the substrate 150 may comprise at least one of ceramic sapphire and glass. This provides for the possibility of a durable and yet at least partially translucent or transparent substrate 150. The material of the substrate 150 may comprise silicon.

The substrate 150 surface may comprise a multi-faceted surface structure 160 according to an embodiment of the present invention. The substrate 150 surface is configured to at least partially refract, reflect, and/or diffract, the light emitted from the at least one LED filament 120 during operation. Not shown in FIG. 2 is that the substrate 150 surface may comprise a lens structure and/or a grating structure which shall be apparent according to the following embodiments.

According to an embodiment, at least one of the combinations of the first surface, $S_1$, and the second surface, $S_2$; the third surface, $S_3$, and the fourth surface, $S_4$; and the first surface, $S_1$, the second surface, $S_2$, the third surface, $S_3$, and the fourth surface, $S_4$, of the surfaces shown in FIG. 2 may comprise a multi-faceted surface structure 160 schematically shown in FIG. 2, a lens structure and/or a grating structure.

The LED filament 120 may preferably have a length L in the range from 1 cm to 20 cm, more preferably 2 cm to 12 cm, and most preferred 3 cm to 10 cm. The LED filament 120 may preferably have a width W in the range from 0.5 mm to 10 mm, more preferably 0.8 mm to 8 mm, and most preferred 1 to 5 mm. The aspect ratio L/W is preferably at least 5, more preferably at least 8, and most preferred at least 10.

The LED filament 120 comprises an array or "chain" of LEDs 140 which is arranged on the LED filament 120. For example, the array or "chain" of LEDs 140 may comprise a plurality of adjacently arranged LEDs 140 wherein a respective wiring is provided between each pair of LEDs 140. The plurality of LEDs 140 preferably comprises more than 5 LEDs, more preferably more than 8 LEDs, and even more preferred more than 10 LEDs. The plurality of LEDs 140 may be direct emitting LEDs which provide a color. The LEDs 140 are preferably blue LEDs. The LEDs 140 may also be UV LEDs. A combination of LEDs 140, e.g. UV LEDs and blue light LEDs, may be used. The LEDs 140 may comprise laser diodes. The light emitted from the LED filament 120 during operation is preferably white light. The white light is preferably within 15 SDCM (standard deviation of color matching) from the black body locus (BBL). The color temperature of the white light is preferably in the range of 2000 to 6000 K, more preferably in the range from 2100 to 5000 K, most preferably in the range from 2200 to 4000 K such as for example 2300 K or 2700 K. The white light has preferably a CRI of at least 75, more preferably at least 80, most preferably at least 85 such as for example 90 or 92.

Alternatively, the light emitted from the LED filament 120 during operation may be colored, for instance by applying red, green and blue LEDs or other colored LEDs.

The LED filament 120 in FIG. 2 shows the LEDs 140 centered on the substrate 150 along a direction parallel to the second axis, B. In other words, in FIG. 2 the LEDs 140 are positioned along a center-line parallel to the first axis, A, whereby the center-line is centered on the substrate 150 along the second axis, B. It should be understood that the LEDs 140 may be arranged in other patterns and positions along the elongation of the substrate 150 of the LED filament 120. For instance, the LEDs 140 may all be positioned along the center-line or off-centered to either side of the center-line. It is to be understood than even if FIG. 2 illustrates that one side of the filament, $S_1$, has LEDs 140 attached, also the opposing side, $S_2$, may have LEDs 140 attached to it. In other words, both surfaces, $S_1$ and $S_2$ may have LEDs 140 attached.

Figure 3:
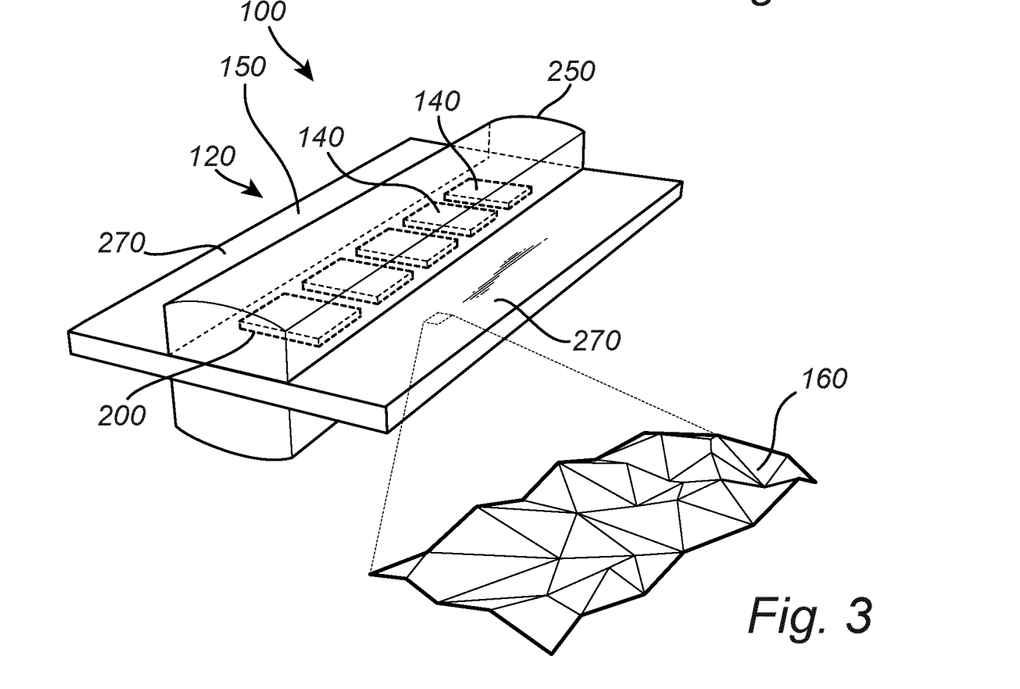

FIG. 3 schematically shows a perspective view of a LED filament arrangement 100 according to an exemplifying embodiment. The LED filament arrangement 100 comprises a LED filament 120 comprising an array of a plurality of LEDs 140. The LED filament 120 further comprises a substrate 150 on which the plurality of LEDs 140 is arranged, wherein the substrate 150 surface may comprise a multi-faceted surface structure 160. The at least one LED filament 120 may further comprise an encapsulant 250 comprising a translucent material. The encapsulant 250 at least partially encloses the plurality of LEDs 140 and at least partially encloses the substrate 150. The substrate 150 surface is further configured to at least partially refract, at least partially reflect, and/or at least partially diffract, the light emitted from the at least one LED filament 120 during operation. At least a part of the substrate surface may be configured to also at least partially refract, reflect, and/or diffract at least a part of the light scattered or converted in the encapsulant 250 material. In other words, light emitted from the LEDs 140 may directly or indirectly be partially refracted, at least partially reflected, and/or at least partially diffracted in or on at least a part of the substrate surface. The encapsulant 250 may be arranged onto the LED filament 120 so that it at least partially encloses the plurality of LEDs 140 and at least partially encloses the substrate 150. The encapsulant 250 may be arranged so that at least part of the substrate 150 is covered. The encapsulant 250 may cover the whole substrate 150. The encapsulant 250 may be applied onto both the side comprising the attached LEDs 140 and onto the opposing side. For example, the encapsulant 250 may be applied onto surface $S_1$, that may have the LEDs 140 attached, and in addition the encapsulant 250 may be applied in similar fashion to the opposing surface, $S_2$. In other words, the encapsulant 250 may be applied on both surfaces $S_1$ and $S_2$.

FIG. 3 also shows that the substrate 150 may comprise at least one second portion 270 which is not enclosed by the encapsulant 250, and wherein at least one of the at least one second portion 270 comprises a multi-faceted surface structure 160 (not shown in the FIG. 3 is that the substrate surface may alternatively comprise a lens structure and/or a grating structure). In FIG. 3, two second portions 270 are shown, one on each side of the encapsulant 250 material, dividing the elongated substrate 150 in two equal regions constituting the two second portions 270. The LEDs 140 may be located centered or off-centered and thus the encapsulant 250 material may be located centered or off-centered on the substrate, creating two second portions 270 of same or different size or just one second portion 270 on the surface of the substrate 150.

The surface on which the LEDs 140 are attached may preferably be flat. The flat part of the surface may be large enough for the LEDs 140 and the encapsulant 250 to be provided thereon. In other words, the substrate 150 may comprise a flat region where the encapsulant 250 is applied.

The surface structure of the second portion 270 affects the light from the LEDs 140 and/or the light scattered or converted in the encapsulant 250 material, impinging on the surface by refraction, reflection and/or diffraction where there is no encapsulant 250 material. In other words, the surface structure in the second portion 270 comprises at least one of a multi-faceted surface structure 160, a lens structure, and a grating structure, and light emitted from the LEDs 140 under operation may then impinge onto the substrate 150 surface structure and on the second region 270 and/or the light from the LEDs 140 may be scattered and/or converted in the encapsulant 250 material and subsequently impinge onto the surface structure of the substrate 150 and on the second region 270.

Preferably, the encapsulant 250 comprises a material suitable to scatter the light emitted from the LEDs 140, such as glass, doped glass or any equivalent thereof. More preferably the encapsulant 250 comprises a material suitable to convert the light from the LEDs 140, such as a luminescent material. Most preferably the encapsulant 250 comprises phosphor according to an embodiment of present invention. This provides for the light from the LEDs 140 to be converted in the encapsulant 250 due to the luminescent properties of phosphor.

Figure 4:
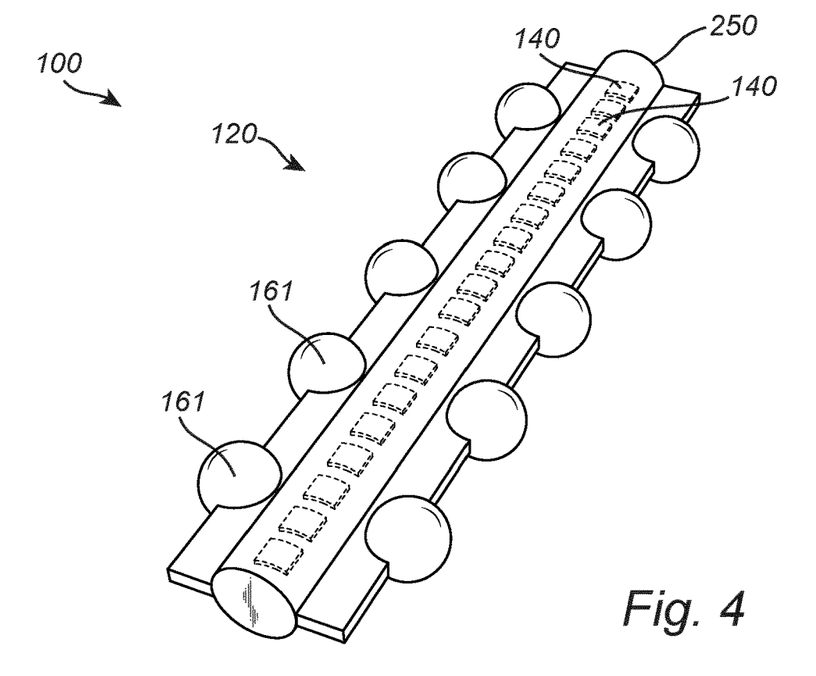

FIG. 4 schematically shows a perspective view of a LED filament arrangement 100 according to an exemplifying embodiment of the present invention. The substrate 150 may comprise a lens structure 161 comprising protrusions of spherical and/or ellipsoidal shape positioned throughout the surface of the substrate 150. The substrate 150 may comprise semi-spherical and/or semi-ellipsoidal protrusions as shown in FIG. 4. The semi-spherical and/or semi-ellipsoidal protrusions may be formed from the substrate 150 or applied onto the substrate 150. The semi-spherical and/or semi-ellipsoidal protrusions may be arranged on any of the surfaces, $S_1$-$S_6$, of the substrate 150 according to FIG. 2. These protrusions may alternatively of furthermore be arranged on any edge between any pair of adjacently arranged surfaces, $S_1$-$S_6$, and/or arranged on any combination of surfaces. The lens structure 161 comprising protrusions may be referred to as a convex lens structure.

The lens structure 161 may comprise recesses of semi-spherical or semi-ellipsoidal shape, creating lens shaped structures bent inwards in the substrate 150. The lens structure 161 comprising recesses may be referred to as a concave lens structure.

By the term "semi-spherical" or "semi-ellipsoidal", it is here meant part of a sphere or ellipsoid in this case either protruding from the surface or bending inwards in the surface.

Figure 5:
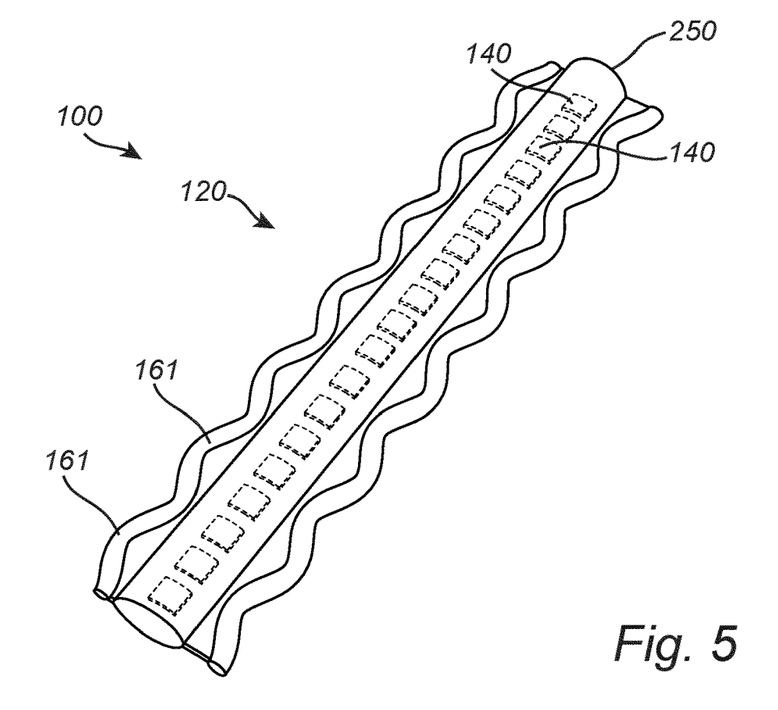

FIG. 5 schematically shows a perspective view of a LED filament arrangement 100 according to an exemplifying embodiment of the present invention. The substrate 150 may comprise a lens structure 161 of an elongated rounded protrusion as illustrated in FIG. 5. This elongated rounded protrusion in FIG. 5 is arranged substantially on one of the sides of the substrate 150. The size and/or shape of the protrusion may be designed in such a way that several surfaces of the substrate 150 are covered, as in the case in FIG. 5. Hence, it should be understood that the elongated protrusions may be of any size and shape and arranged on any surface of the substrate 150. The protrusions may be arranged at any position suitable to affect light emitted from the LEDs 140 and/or light from the LEDs 140 scattered in a possible encapsulant according to any embodiment of the present invention. The elongated rounded protrusion in FIG. 5 has a curved or crisscross shape. The elongated rounded protrusion may be arranged along a straight line. The elongated rounded protrusions may be arranged as several protrusions arranged on any of the surfaces or edges between adjacent surfaces of the substrate 150. The size of the elongated rounded protrusions in relation to the substrate 150 may be smaller or larger than those shown in FIG. 5.

Figure 6:
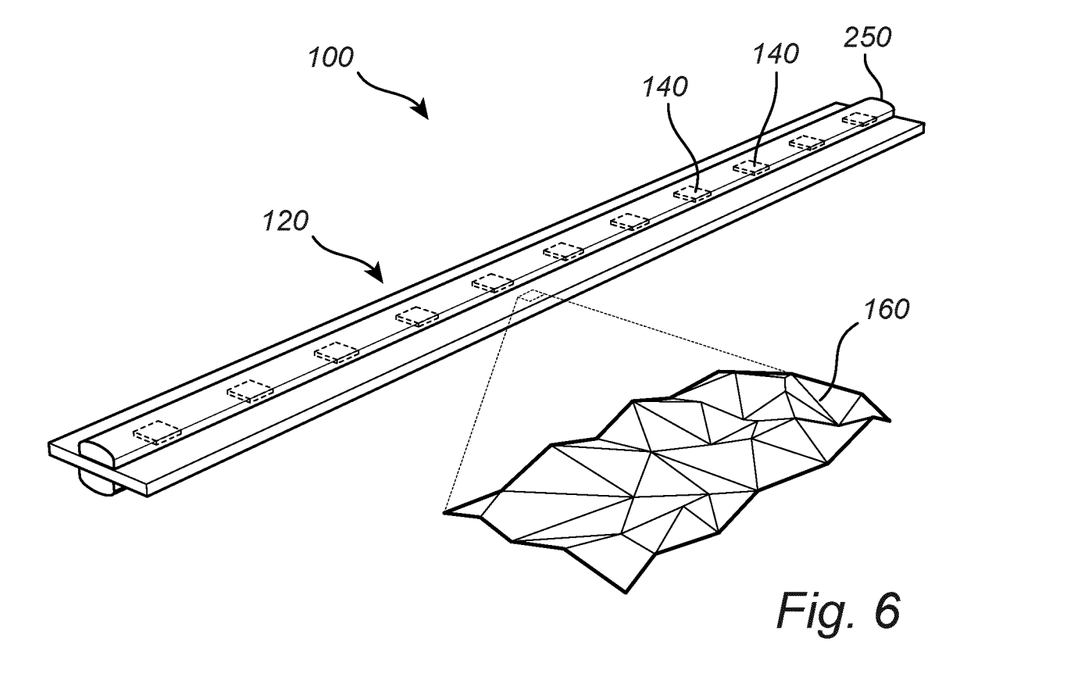

FIG. 6 schematically shows a perspective view of a LED filament arrangement 100 according to an exemplifying embodiment of the present invention. A plurality LEDs 140 is attached to the surface of the substrate. A multi-faceted surface structure 160 according to an aspect of the present invention is schematically illustrated. The multi-faceted surface structure 160 could be arranged on parts of the surface of the substrate, or even on the whole substrate surface. The multi-faceted surface structure 160 could be arranged on any of the six enclosing surfaces on the LED filament 120. In addition, FIG. 6 shows an encapsulant 250 that may be present according to some embodiments of the present invention.

Figure 7:
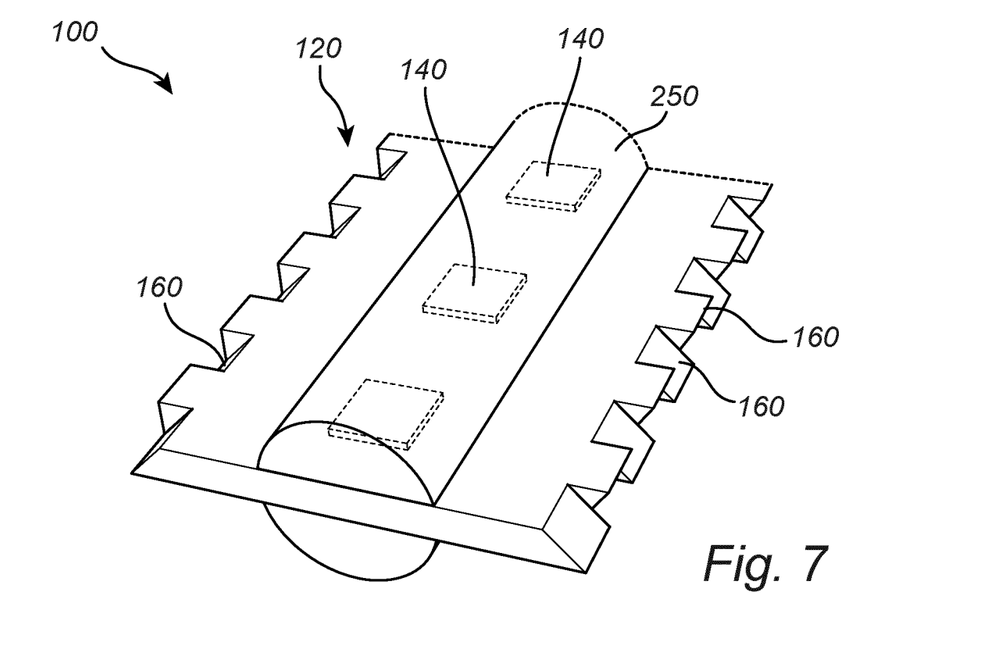

FIG. 7 schematically shows a perspective view of a LED filament arrangement 100 according to an exemplifying embodiment of the present invention. A plurality of LEDs 140 is attached to the surface. A multi-faceted surface structure 160 according to an aspect of present invention is schematically illustrated on two oppositely arranged surfaces of the substrate 150.

FIGS. 8a-8f schematically show the LED filament arrangement 100 from the side. With reference to FIG. 2, the examples typically show the substrate surface $S_5$ facing towards the reader. The figures schematically show possible combinations of the surfaces, $S_1$-$S_6$, of the substrate that may comprise a multi-faceted surface structure 160, a lens structure 161, and/or a grating structure 162. Specifically, the grating structure 162 could be any type of grating structure affecting the light from the LEDs 140 by refraction, reflection and/or diffraction of the light from the LEDs 140 impinging on the surface. The grating structure 162 may be applied as gratings along the surface of the substrate 150 lengthwise stretching straight from one side to another or in patterns, such as zigzag or crisscross throughout the surface. The grating structure 162 may be wide and deep enough to affect the light from the LEDs 140 by refraction, reflection, and/or diffraction. It is considered obvious for a person skilled in the art to adapt the width and depth of the grating structure 162 to the wave length used in order to achieve desired performance once given the insight of the inventive concept of using the grating structure 162 according to this invention to have light refract, reflect, and/or diffract in the surface. As discussed the grating structure 162 may be applied onto the corners of the substrate 150 between two adjacent surfaces.

It should be understood that other combinations not shown in FIGS. 8a-8f are possible, including the surface facing the reader, $S_5$, and its opposing surface, $S_6$, comprising a multi-faceted surface structure 160, a lens structure 161, and/or a grating structure 162. In addition, FIGS. 8a-8f show an encapsulant 250 that may be present according to one or more embodiments of the present invention.

Figures 8A, 8B, 8C, 8D, 8E, 8F:
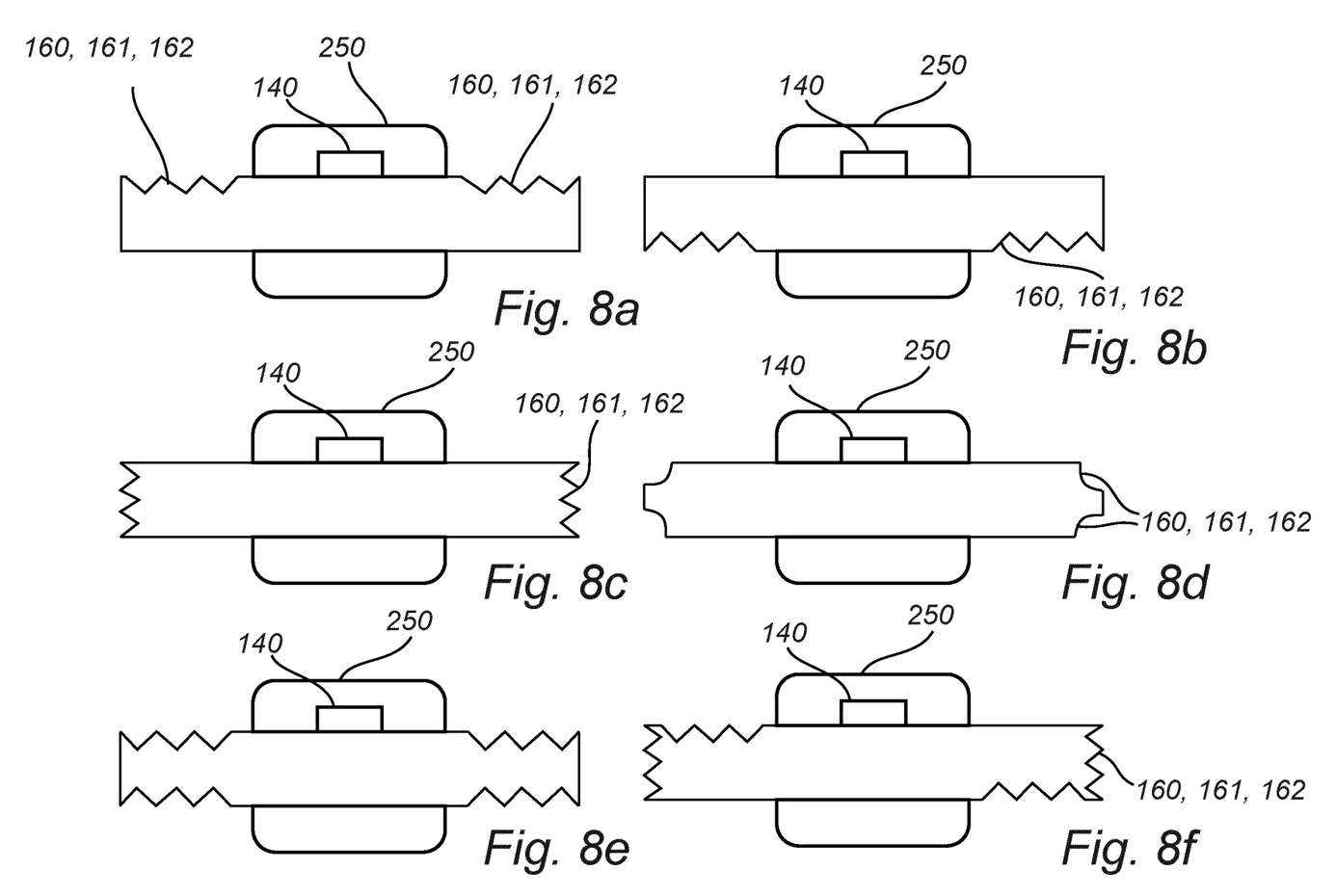
FIGS. 8a-8f and 9 schematically shows a LED filament arrangement from the side according to exemplifying embodiment of the present invention.

It should be understood that the whole surface or parts of the surface may be covered by a multi-faceted surface structure 160, a lens structure 161, and/or a grating structure 162. There may also be a combination of a multi-faceted surface 160, a lens structure 161, and/or a grating structure 162 onto the same surface. Specifically, FIG. 8d schematically shows the LED filament arrangement 100 from the side and how its corners between two adjacently arranged sides comprise a multi-faceted surface structure 160, a lens structure 161, and/or a grating structure 162. In other words, the substrate comprises a respective edge between any pair of adjacently arranged surfaces, $S_1$-$S_6$, wherein at least one of the respective edges comprises at least one of a multi-faceted surface structure 160, a lens structure 161, and a grating structure 162.

Figure 9:
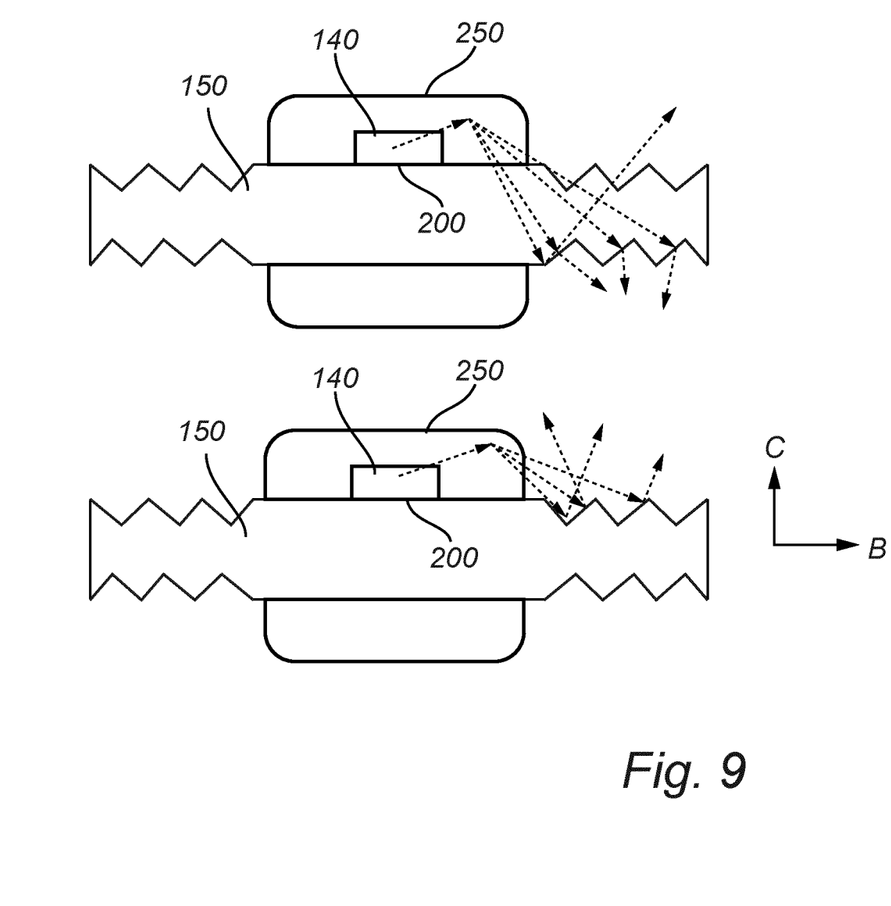

Referring now to FIG. 9a, the substrate 150 may be at least partially translucent or transparent. This provides for a substrate 150 that may enable refraction to be achieved by light passing through the substrate 150. In FIG. 9a, an encapsulant 250 is also shown that may be present according to at least some embodiments of present invention. The encapsulant 250 may scatter or convert light from the LEDs 140, and the scattered or converted light may then impinge onto the substrate 150 surface. The light from the LEDs 140 may alternatively be distributed from the LEDs 140 and directly, without being scattered or converted in the encapsulant 250, impinge onto the substrate 150 surface.

Referring now to FIG. 9b, the substrate 150 may be at least partially opaque. This may provide for a LED filament 120 able to reflect light in a certain, desired direction, thus increasing control of the angle of the light distribution. By the term "at least partially opaque" is meant that at least a part of the substrate 150 may be opaque for a specific range of wavelengths. For example, the substrate 150 may be opaque for light in the range of visible wavelengths in order not to have visible light from the LEDs 140 pass the substrate 150. Alternatively, the substrate 150 may be opaque for light in the range of non-visible wavelengths in order for light outside of the visible wavelength range not to penetrate the substrate 150. It will be appreciated that the LEDs 140 on the LED filament 120 may be mounted on both sides of the substrate 150. In FIG. 9b, an encapsulant 250 is also shown that may be present according to at least some embodiments of present invention. The encapsulant 250 may scatter or convert light from the LEDs 140 and the scattered or converted light may then impinge onto the substrate surface. The light from the LED 140 may be distributed from the LED 140 and directly, without being scattered or converted in the encapsulant 250, impinge onto the surface.

If the substrate 150 is at least partially translucent or transparent the light may be impinging the surface from outside the substrate 150 or from within the substrate 150. The light may be distributed from the LEDs 140 under operation and, if the substrate 150 is translucent or transparent subsequently enter the substrate 150 by refraction. The light may then be reflected within the substrate 150 and/or exit the substrate 150 once again through refraction. The reflection within or on the surface of the substrate 150 may be due to total internal reflection.

According to one or more embodiments as described, the LED filament arrangement 100 may comprise at least one first portion 200 of the substrate 150, on which the plurality of LEDs 140 is arranged, that is flat. The flat first portion 200 of the substrate 150 may hereby provide a surface which is optimal to apply LEDs 140 upon. The first portion 200 of the substrate 150 which is flat may also be large enough so that both the LEDs 140 and the encapsulant 250 may be arranged thereon.

Figure 10:
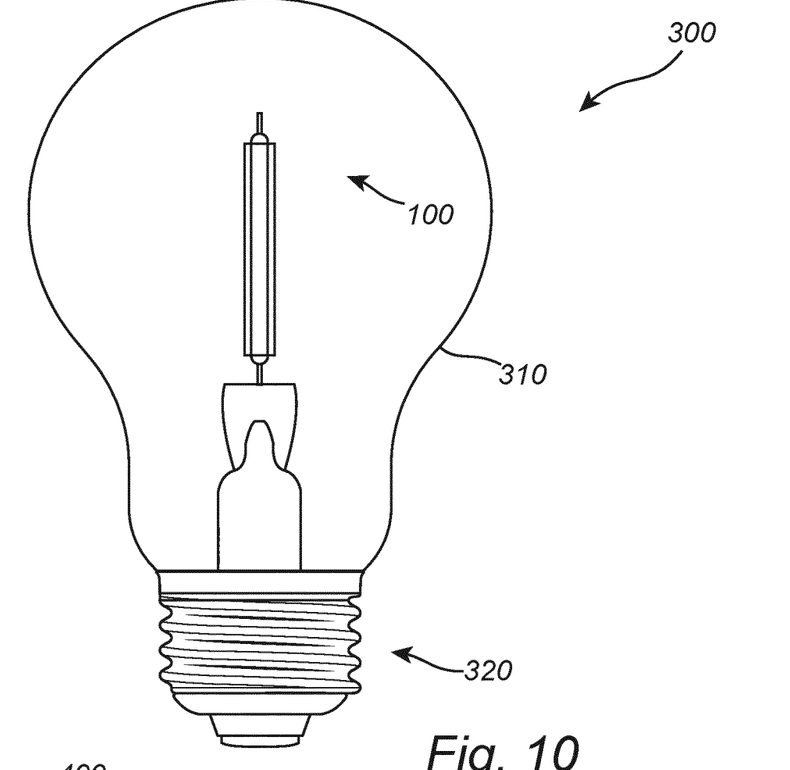
FIG. 10 schematically shows a lighting device comprising a LED filament arrangement according to an exemplifying embodiment of the present invention.

FIG. 10 schematically shows a lighting device 300 comprising a LED filament arrangement 100 according to any preceding embodiment of present invention. The lighting device 300 further comprises a cover 310 comprising an at least partially light transmissive material, wherein the cover 310 at least partially encloses the LED filament arrangement 100. The lighting device 300 further comprises an electrical connection 320 connected to the LED filament arrangement 100 for a supply of power to the plurality of LEDs of the LED filament arrangement 100.

Figure 11:
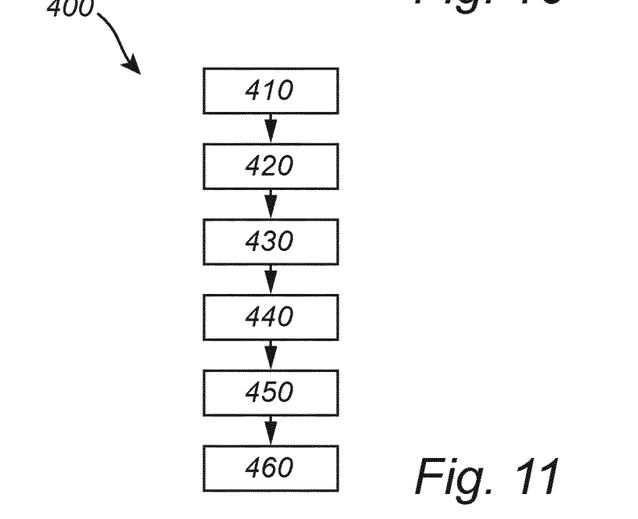
FIG. 11 schematically shows the steps of a method of manufacturing a LED filament arrangement.

FIG. 11 schematically shows the steps in a method 400 of manufacturing a LED filament arrangement 100, comprising providing 410 a substrate which has the shape of a rectangular slab and elongates along a longitudinal first axis. The substrate further extends along a second axis being perpendicular to said first axis and extends along a third axis being perpendicular to both said first and second axes. The substrate comprises a first surface comprising a first normal which is parallel to said third axis, a second surface comprising a second normal in the opposite direction to said first normal, a third surface comprising a third normal which is parallel to said second axis; and a fourth surface comprising a fourth normal in the opposite direction to said third normal. The method further comprising creating 420 an electrode pattern on at least one of the first surface and the second surface of the substrate. The method further comprising mounting 430 a plurality of LEDs on at least one of the first surface and the second surface of the substrate. The method further comprises arranging 440 a wire bonding between the plurality of LEDs and the electrode pattern. The method further comprising dispensing 450 a translucent material on at least a portion of the first surface and the second surface of the substrate 150. The method further comprising creating 460 a multi-faceted surface structure, a lens structure, and/or a grating structure on at least a portion of at least one of the first surface, the second surface, the third surface, and the fourth surface.

According to an embodiment, the method of manufacturing a LED filament arrangement may further comprise a substrate that is at least partially translucent or transparent. According to an embodiment, the method of manufacturing a LED filament arrangement may further comprise a substrate that is at least partially opaque.

The person skilled in the art realizes that the present invention by no means is limited to the preferred embodiments described above. On the contrary, many modifications and variations are possible within the scope of the appended claims. For example, one or more of the LED filament(s) 120, the substrate 150, etc., may have different shapes, dimensions and/or sizes than those depicted/described.

The invention claimed is:

1. A light emitting diode, LED, filament arrangement, comprising at least one LED filament comprising an array of a plurality of light emitting diodes, LEDs, and
a substrate comprising a first surface S1 and a second surface S2 opposite to the first surface S1, said at least one LED filament being arranged on a first portion of said first surface S1, and,
wherein the at least one LED filament further comprises an encapsulant comprising a translucent material, wherein the encapsulant at least partially encloses the plurality of LEDs and at least partially encloses the first surface S1, said first surface S1 comprises at least one second portion which is not enclosed by the encapsulant, and wherein at least one of the at least one second portion comprises at least one of a multi-faceted surface structure, a lens structure and a grating structure and is configured to at least partially refract, at least partially reflect, and/or at least partially diffract, the light emitted from the at least one LED filament during operation.

2. The LED filament arrangement according to claim 1, wherein the substrate is at least partially translucent or transparent.

3. The LED filament arrangement according to claim 1, wherein the substrate is at least partially opaque.

4. The LED filament arrangement according to claim 1, wherein at least the one first portion of the substrate, on which the plurality of LEDs is arranged, is flat.

5. The LED filament arrangement according to claim 3, wherein the encapsulant comprises phosphor.

6. The LED filament arrangement according to claim 1, wherein the substrate has the shape of a rectangular slab and elongates along a longitudinal first axis, A, wherein the substrate further extends along a second axis, B, being perpendicular to said first axis, A, and further extends along a third axis C, being perpendicular to both said first and second axes, wherein at least one of the surfaces, S1-S6, of the substrate comprises at least one of a multi-faceted surface structure, a lens structure, and/or grating structure.

7. The LED filament according to claim 6, wherein the substrate comprises a first surface, S1, comprising a first normal which is parallel to said third axis, a second surface, S2, comprising a second normal in the opposite direction to said first normal, a third surface, S3, comprising a third normal which is parallel to said second axis; and a fourth surface, S4, comprising a fourth normal in the opposite direction to said third normal, wherein at least one of the first surface, S1, the second surface, S2, the third surface, S3, and the fourth surface, S4, comprises at least one multi-faceted surface structure, lens structure, and/or grating structure.

8. The LED filament arrangement according to claim 7, wherein at least one of the combinations of the first surface, S1, and the second surface, S2;

the third surface, S3, and the fourth surface, S4; and the first surface, S1, the second surface, S2, the third surface, S3, and the fourth surface, S4, comprises at least one of a multi-faceted surface structure, lens structure, and/or grating structure.

9. The LED filament arrangement according to claim 7, wherein the substrate comprises a respective edge between any pair of adjacently arranged surfaces, S1-S6, wherein at least one of the respective edges comprises at least one multi-faceted surface structure, lens structure, and/or grating structure.

10. A lighting device, comprising a LED filament arrangement according to claim 1, a cover comprising an at least partially light transmissive material, wherein the cover at least partially encloses the LED filament arrangement, and an electrical connection connected to the LED filament arrangement for a supply of power to the plurality of LEDs of the LED filament arrangement.

11. A method of manufacturing a light emitting diode, LED, filament arrangement, comprising providing a substrate which has the shape of a rectangular slab and elongates along a longitudinal first axis, A, wherein the substrate further extends along a second axis, B, being perpendicular to said first axis, A, and extends along a third axis C, being perpendicular to both said first and second axes, wherein the substrate comprises a first surface, S1, comprising a first normal which is parallel to said third axis, a second surface, S2, comprising a second normal in the opposite direction to said first normal, a third surface, S3, comprising a third normal which is parallel to said second axis; and a fourth surface, S4, comprising a fourth normal in the opposite direction to said third normal, creating an electrode pattern on at least one of the first surface, S1, and the second surface, S2, of the substrate;

mounting a plurality of light-emitting diodes, LEDs, on at least one of the first surface, S1, and the second surface, S2, of the substrate;

arranging a wire bonding between the plurality of LEDs and the electrode pattern;

dispensing a translucent material forming an encapsulant on at least a first portion of the first surface, S1, and the second surface, S2, of the substrate and said substrate comprises at least one second portion which is not enclosed by the encapsulant; and creating at least one of a multi-faceted surface structure, a lens structure, and a grating structure on at least one second portion of said substrate of at least one of the first surface, S1, the second surface, S2, the third surface, S3, and the fourth surface, S4.

12. The method of manufacturing a LED filament arrangement according to claim 11, wherein the substrate is at least partially translucent or transparent.

13. The method of manufacturing a LED filament arrangement according to claim 11, wherein the substrate is at least partially opaque.

* * * * *